(12) United States Patent
Rylov

(10) Patent No.: US 8,552,783 B2
(45) Date of Patent: Oct. 8, 2013

(54) PROGRAMMABLE DELAY GENERATOR AND CASCADED INTERPOLATOR

(75) Inventor: Sergey V. Rylov, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 13/158,079

(22) Filed: Jun. 10, 2011

(65) Prior Publication Data

US 2012/0313683 A1 Dec. 13, 2012

(51) Int. Cl.
*H03H 11/26* (2006.01)

(52) U.S. Cl.
USPC .......................................... 327/276; 327/278

(58) Field of Classification Search
USPC .................................. 327/276, 278
See application file for complete search history.

(56) References Cited

U.S. PATENT DOCUMENTS

| | | | |
|---|---|---|---|
| 6,014,047 A | 1/2000 | Dreps et al. | |
| 6,606,576 B2 | 8/2003 | Sessions | |
| 6,636,570 B1 | 10/2003 | Choi et al. | |
| 7,327,783 B2 | 2/2008 | Sullivan | |
| 7,602,869 B2 | 10/2009 | Emami-Neyestanak et al. | |
| 7,741,889 B2 | 6/2010 | Chou | |
| 7,750,707 B2 | 7/2010 | Momtaz | |
| 7,751,519 B2 | 7/2010 | Farbarik et al. | |
| 2005/0024107 A1* | 2/2005 | Takai et al. | 327/158 |
| 2005/0242855 A1* | 11/2005 | Lee | 327/158 |
| 2007/0030045 A1* | 2/2007 | Takai et al. | 327/263 |
| 2008/0136485 A1* | 6/2008 | Takai et al. | 327/263 |
| 2009/0195286 A1 | 8/2009 | Rylov | |
| 2010/0109734 A1 | 5/2010 | Rylov | |
| 2010/0264960 A1* | 10/2010 | Jeong | 327/114 |
| 2011/0163787 A1* | 7/2011 | Wan | 327/158 |

FOREIGN PATENT DOCUMENTS

| | | |
|---|---|---|
| JP | 53137393 A2 | 11/1978 |
| JP | 2010124109 A2 | 6/2010 |

OTHER PUBLICATIONS

Bulzacchelli, et al., "A 10-Gb/s 5-Tap DFE/4-Tap FFE Transceiver in 90-nm CMOS Technology" IEEE Journal of Solid-State Circuits, vol. 41, No. 12, Dec. 2006, pp. 2885-2900.
Knickerbocker, et al., "3-D silicon integration and silicon packaging technology using silicon through—vias",IEEE Journal of Solid-State Circuits , vol. 41, No. 8, pp. 1718-1725, Aug. 2006.
O'Mahony, et al., "A 47×10Gb/s 1.4mW/(Gb/s) Parallel Interface in 45nm CMOS", IEEE International Solid-State Circuits Conference, ISSCC Dig. Tech. Papers, pp. 156-157, Feb. 2010.
Sidiropoulos, et al., "A Semi-Digital DLL with Unlimited Phase Shift Capability and 0.08-400MHz Operating Range" ISSCC Digest of Technical Papers, pp. 332-333, Feb. 1997.

* cited by examiner

*Primary Examiner* — Ryan Jager
(74) *Attorney, Agent, or Firm* — Tutunjian & Bitetto, P.C.; Anne V. Dougherty

(57) ABSTRACT

A programmable delay generator and a cascaded interpolator are provided. The programmable delay generator includes a first delay line and a second delay line, each having a respective plurality of stages of the same number. Each stage of the first line includes a respective delay buffer and has one signal input and one signal output. Each stage of the second line includes a respective selecting element and has two signal inputs, one select input for selecting one of the two signal inputs, and one signal output. The first line and the second line are configured in parallel, are interconnected, and have a same signal propagation direction. Each delay step provided by each stage of the second line is equal to a difference between a delay through one stage of the first line and a delay through one stage of the second line.

16 Claims, 12 Drawing Sheets

PROGRAMMABLE DELAY GENERATOR AND CASCADED INTERPOLATOR

GOVERNMENT RIGHTS

This invention was made with Government support under Contract No.: H98230-07-C-0409 awarded by the National Security Agency. The Government has certain rights in this invention.

BACKGROUND

1. Technical Field

The present invention generally relates to the processing of clock signals and, more particularly, to a programmable delay generator of equal delay steps and a cascaded interpolator.

2. Description of the Related Art

Phase rotators are critical components of clock subsystems of modern data processing and communications systems. Phase rotators are circuits that modify, in a highly precise and reproducible fashion, the phase of clock signals within an unlimited phase range and therefore are capable of generating clock signals with programmable phase and frequency offsets. A very general approach to building phase rotators is to use a two-stage circuit, where the first stage performs generation of a fixed set of clock phases that are uniformly distributed on a phase circle and/or selection of two adjacent phases from such a set, that is followed by the second stage that interpolates between the two selected phases using a high-precision interpolator circuit. The most common way to generate a set of coarse clock phases is to use a Delay Locked Loop (DLL) composed of the required number of identical delay stages, or obtain them using a divider of a higher clock frequency. Interpolation is conventionally done with current-mode logic (CML) mixers driven with current-mode digital-to-analog converters (DACs). While highly linear, CML interpolators have poor compatibility with most recent circuit designs that are predominantly of the CMOS type, i.e., of the type that employ full (rail-to-rail) signal swing and cannot directly use reduced-swing CML clocks.

One can implement an interpolator that is CMOS-compatible by using a combination of two (or more) groups of dotted CMOS tri-state inverters, with each group receiving a common input signal and all groups having one common output. The interpolation weights in this case are simply the numbers of active inverters in each group (a tristate inverter can be either fully on or off). However this method has lower linearity, and its nonlinearity increases with increases of the mutual delay of the clock phases, so it is generally limited to mutual delays of 45 degrees or less. Another disadvantage is the rigid relationship between the interpolation accuracy in bits and the number of inverters present in the circuit, the latter doubling with each extra bit of accuracy. For example, to create one output clock phase with 16 equidistant interpolated states (4 bits of accuracy) one needs at least 32 tri-state inverters for a single-ended output and 64 inverters for a dual-rail output. An immediate consequence of such use of 2^n elements to achieve n-bit accuracy is that such interpolator is natively controlled with a thermometer code. However, a thermometer code uses N−1 bits to represent N states, while binary code uses log 2(N) bits to represent N states.

The large number of coarse clock phases required by CMOS-type interpolators creates another important problem, namely skew introduced by the selection of the coarse phases from a large set, where a skew-free selection of the coarse phases from a large set is desired. However, the skew-free selection of the coarse phases from a large set is challenging due to the significant size of phase-generation circuitry and the generally non-uniform topology of such a selector.

SUMMARY

According to an aspect of the present principles, there is provided a programmable delay generator of equal delay steps. The programmable delay generator includes a first delay line and a second delay line. The first delay line has a plurality of stages. Each of the plurality of stages includes a respective delay buffer and has one signal input and one signal output. The second delay line has a plurality of stages equal in number to the plurality of stages of the first delay line. Each of the plurality of stages of the second delay line includes a respective selecting element and has two signal inputs, one select input for selecting one of the two signal inputs, and one signal output. The first delay line and the second delay line are configured in parallel with respect to each other, are interconnected, and have a same signal propagation direction. Each of the delay steps provided by each of the plurality of stages of the second delay line is equal to a difference between a delay through one of the plurality of stages of the first delay line and a delay through one of the plurality of stages of the second delay line.

According to another aspect of the present principles, there is provided a method for programmable delay generation of equal delay steps. The method includes forming a first delay line having a plurality of stages. Each of the plurality of stages includes a respective delay buffer and having one signal input and one signal output. The method further includes forming a second delay line having a plurality of stages equal in number to the plurality of stages of the first delay line. Each of the plurality of stages of the second delay line includes a respective selecting element and has two signal inputs, one select input for selecting one of the two signal inputs, and one signal output. The first delay line and the second delay line are configured in parallel with respect to each other, are interconnected, and have a same signal propagation direction. Each of the delay steps provided by each of the plurality of stages of the second delay line is equal to a difference between a delay through one of the plurality of stages of the first delay line and a delay through one of the plurality of stages of the second delay line.

According to yet another aspect of the present principles, there is provided a cascaded interpolator. The cascaded interpolator includes a plurality of interpolator stages. Each of the plurality of interpolator stages has two signal inputs and two signal outputs, and is configured to receive two input signals having two different phases and to generate therefrom two output signals that have a phase separation equal to a fraction of a phase separation of the two input signals. The cascaded interpolator further includes a phase converter connected to a last stage of the plurality of single-bit interpolator stages. The phase converter is configured to convert the two output signals into a single final output signal of a given phase.

According to still another aspect of the present principles, there is provided a method for cascaded interpolation. The method includes forming a plurality of interpolator stages. Each of the plurality of interpolator stages has two signal inputs and two signal outputs, and is configured to receive two input signals having two different phases and to generate therefrom two output signals that have a phase separation equal to a fraction of a phase separation of the two input signals. The method further includes forming a phase converter connected to a last stage of the plurality of single-bit interpolator stages. The phase converter is configured to convert the two output signals into a single final output signal of a given phase.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
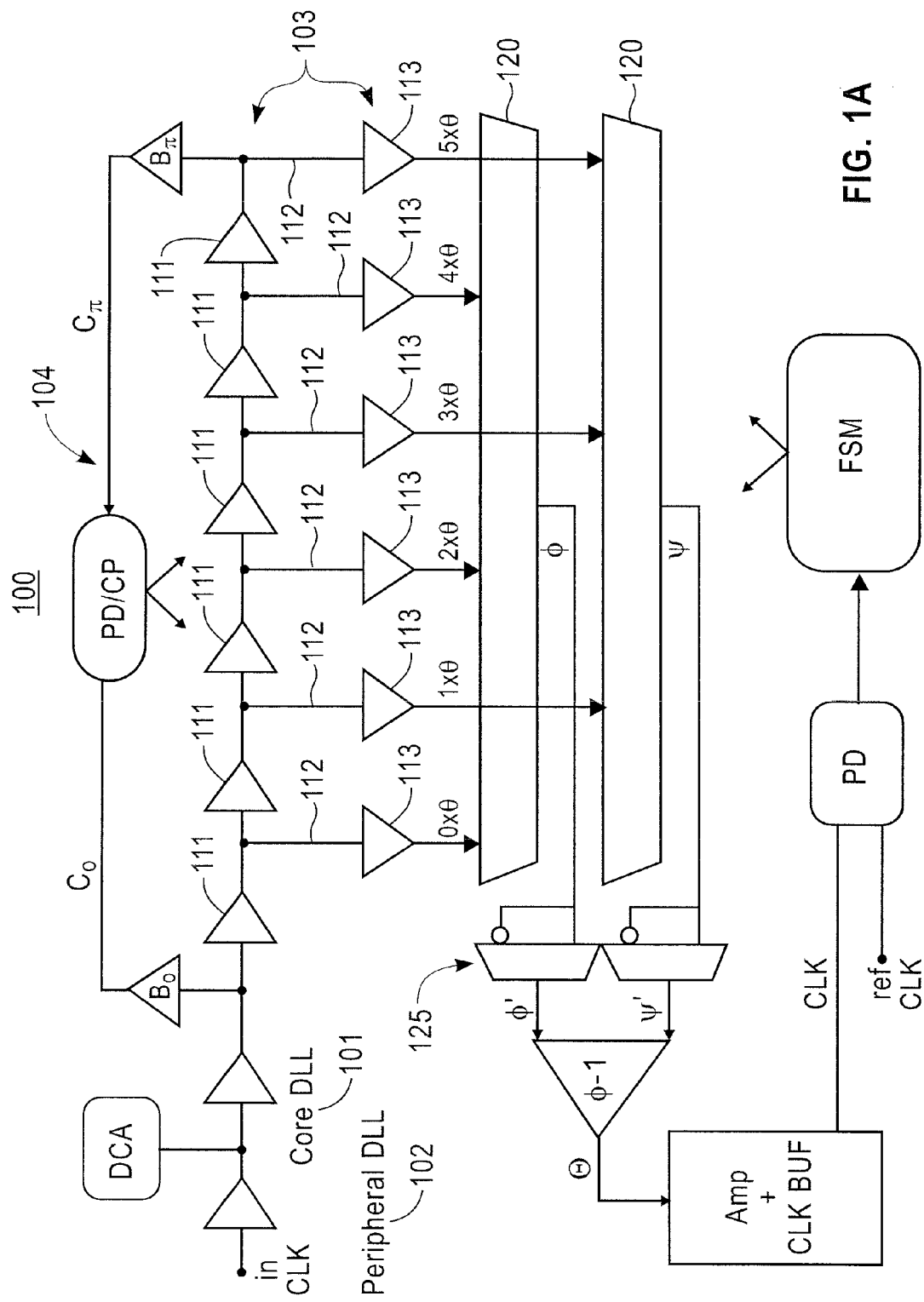
FIGS. 1A and 1B are diagrams collectively showing a two-stage phase rotator 100, in accordance with the prior art.

As noted above, the present principles are directed to programmable delay generator of equal delay steps and a cascaded interpolator. Both the programmable delay generator and the binary encoded cascaded interpolator are implemented as all-CMOS. As used herein, "all-CMOS" refers to a circuit where signals in all points in the circuit have full, rail-to-rail swing.

With respect to one or more embodiments, the present principles aim to create an all-CMOS phase rotator, or elements (e.g., the programmable delay generator and the binary encoded cascaded interpolator) that are capable of being in such a phase rotator, using a novel topology that allows the rotator to merge phase generation and phase selection circuitry into a uniform array of delay stages and switching elements that achieves equidistant separation of the selected phase positions by construction. Moreover, a new topology of the CMOS-type interpolator is introduced that includes a cascade of identical 1-bit sections for significant hardware savings in contrast to conventional thermometer-encoded CMOS interpolators.

Thus, the present principles are directed to an original architecture for an all-CMOS phase rotator, where the architecture can be considered to include two independent components, where each of these components are novel over the prior art. The first component involves the efficient generation of one pair of adjacent clock phases out of a relatively large set of equidistant clock phases (as opposed to a more conventional way to first generate a full set and then to proceed to select just two phases out of that full set). This generation is based on using a uniform array of delay and switching elements that utilizes vernier topology. As used herein, a vernier topology refers to and/or is otherwise directed to, an array where the delay introduced by such array changes in increments equal to a difference between two schematic delays. That is, the delay changes in increments equal to a difference between a signal propagation delay through one stage of a first (main) delay line, and a signal propagation delay through one stage of a second (merging) delay line. The second architecture component involves the use of a multiple stage interpolator that interpolates between the incoming pair of relatively close clock phases using a cascade of identical single-bit sections, each having two inputs and two outputs and one control bit that adds one bit of accuracy to the overall interpolation process. More specifically, each interpolation stage includes a 2:1 MUX and a fixed 1:1 mixer (interpolator). The 2:1 MUX selects one of the two incoming phases as the first output. The fixed 1:1 mixer (interpolator) generates the second output. The last stage in the cascade is terminated with a single 1:1 mixer to produce the final single rotator output. The use of the preceding architecture advantageously results in the situations where, depending on the control bit value in each section, its output pair of phases takes one of two possible configurations, while the spacing between these two phases is reduced by a factor of two.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention aims at advancing the architecture of phase rotators that use full-swing (rail-to-rail) signaling, also known as CMOS signaling, for reduction of circuit power and area compared to circuits that utilize the more traditional signaling for analog circuits, namely reduced-swing differential signaling which is also known as CML signaling. Regardless of the type of the signaling, the vast majority of phase rotator architectures can be described as a two-stage circuit that employs a coarse stage and a fine stage that it is convenient to illustrate using the specific example in FIGS. 1A and 1B.

Figure 1B:
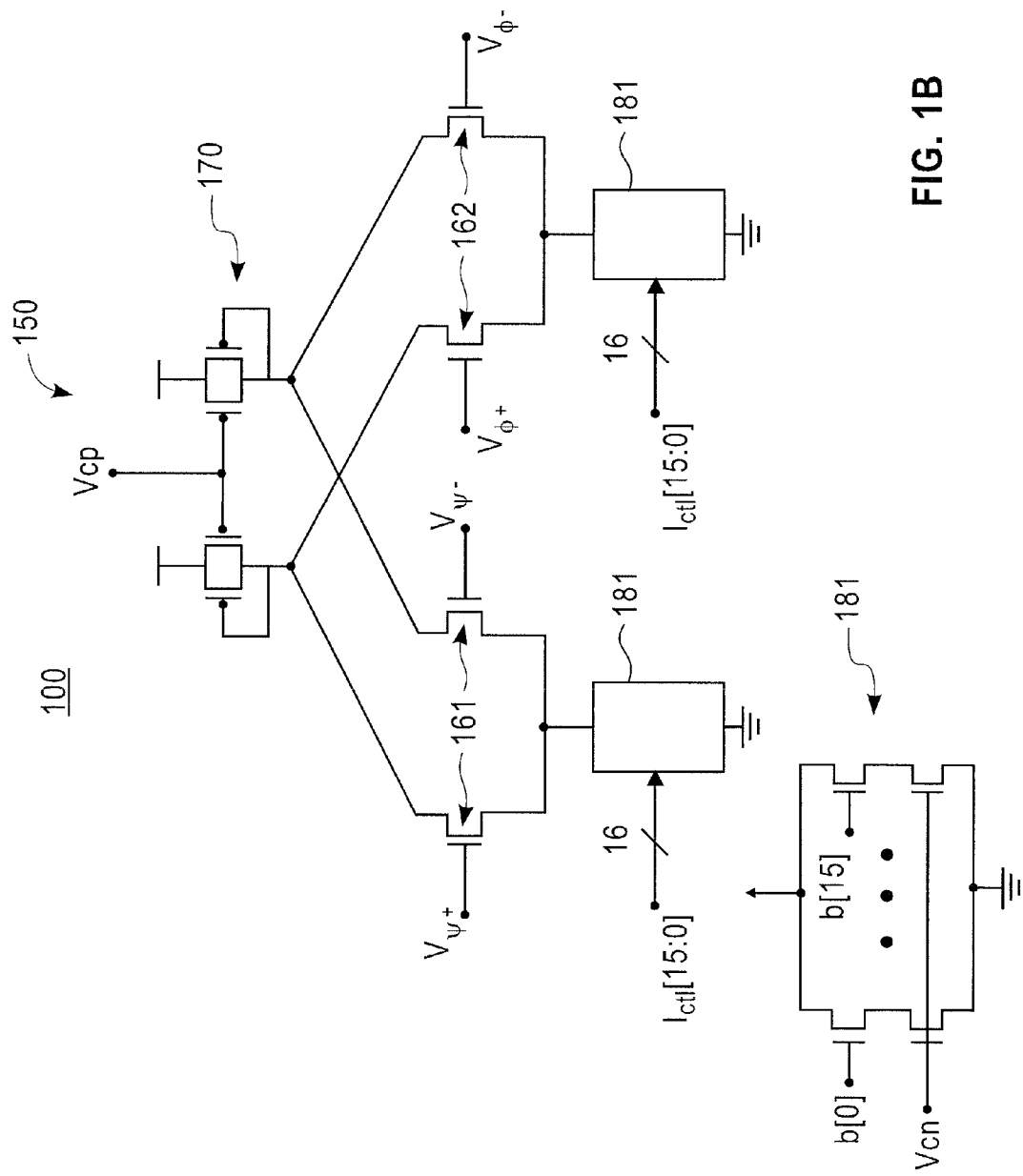

FIGS. 1A and 1B collectively show a two-stage phase rotator 100, in accordance with the prior art. In particular, FIG. 1A shows a Delay-Locked Loop (DLL) 103 and multiplexers 120 of the phase rotator 100, wherein the DLL 103 is for coarse phase generation, and the multiplexers 120 are for coarse phase selection. The DLL 103 includes a core DLL 101 and a peripheral DLL 102. FIG. 1B shows a CML interpolator 150 of the phase rotator 100. The CML interpolator 150 is for fine phase generation.

The DLL 103 is composed of N=6 identical delay stages/elements 111 with controllable delay that is adjusted by the feedback loop 104 to yield an overall phase delay of 180 degrees. Since the delay stages/elements 111 are nominally identical, this phase delay is uniformly distributed between these N elements 111, yielding 180/N=30 degrees of phase delay per each delay element 111. The delay elements 111 are implemented as CML circuits using differential, reduced swing signaling and therefore they automatically provide another 6 complementary phases with a 180 degree shift thus yielding a complete set of 2N=12 clock phases that are uniformly distributed on a phase circle.

The next step within the coarse stage of the rotator 100 shown in FIG. 1A is the selection of two adjacent phases from a full 2N-phase set. This is done by dividing the 6 taps 112

(each having a buffer 113) of the DLL 110 into two groups, even and odd (3 taps each) and passing each group through an individual 3:1 multiplexer 120 followed by a polarity selector 125. The polarity selector 125 is shown in FIG. 1A as a 2:1 multiplexer driven by two opposite polarities of the signal. The select controls of all these multiplexers 120, 125 are operated in such way that the two output clock phases, an even and an odd clock phase, are always located next to each other on a phase circle (further referred to as "adjacent coarse phases"). This completes the description of coarse phase selection.

The two adjacent coarse phases, an even and an odd, are then applied to the fine stage which is implemented using a CML interpolator 150 shown in detail in FIG. 1B. The CML interpolator 150 is realized as a summing circuit that adds together the differential currents from two differential pairs 161, 162 driven by the two coarse clock phases and applies them to a common differential load 170. The amplitudes of these two currents, i.e. their respective interpolation weights, are set using two current DACs 181, 182. Each of the two current DACs 181, 182 includes 16 identical unit sections driven by thermometer code.

The interpolation accuracy of CML interpolators similar to that shown in FIG. 1B is sufficiently high to accurately interpolate between clock phases with phase separation as large as 90 degrees, therefore a majority of CML rotators operate with a set of just four coarse phases, i.e. just two differential clock signals, commonly referred to as In-phase (I) and Quadrature (Q) clock phases, that can be obtained in many cases without use of delay elements, e.g. by using a 2:1 divider of a single differential clock signal at double frequency.

In contrast to CML interpolators, interpolators using CMOS signaling have generally worse linearity and therefore require a larger number of coarse phases with respectively finer spacing to operate adequately (usually 8 phases or more). As a consequence, in the design of phase rotators using CMOS signaling, larger emphasis is put on the precision of the coarse stage that applies to both coarse phase generation and the subsequent selection for the final coarse output.

The root issue of potential inaccuracies in the output coarse phases (obtained via the aforementioned two-step process involving the generation of a complete phase set followed by the selection of just two of the phases in the set) is that the resulting structure is redundant (most phases are not used at any given moment) and the phase collection network that brings the phases to the phase selection devices often lacks symmetry and/or uniformity. To address this issue, the present principles introduce a new topology for coarse phase generation that is free from these deficiencies. More specifically, the new present principles merge delay generation elements and switching (selection) elements in a uniform array of multiple stages that can directly generate the two output coarse phases (belonging to a large set of equidistant phases) without generating the ones that are not needed.

Figure 2:
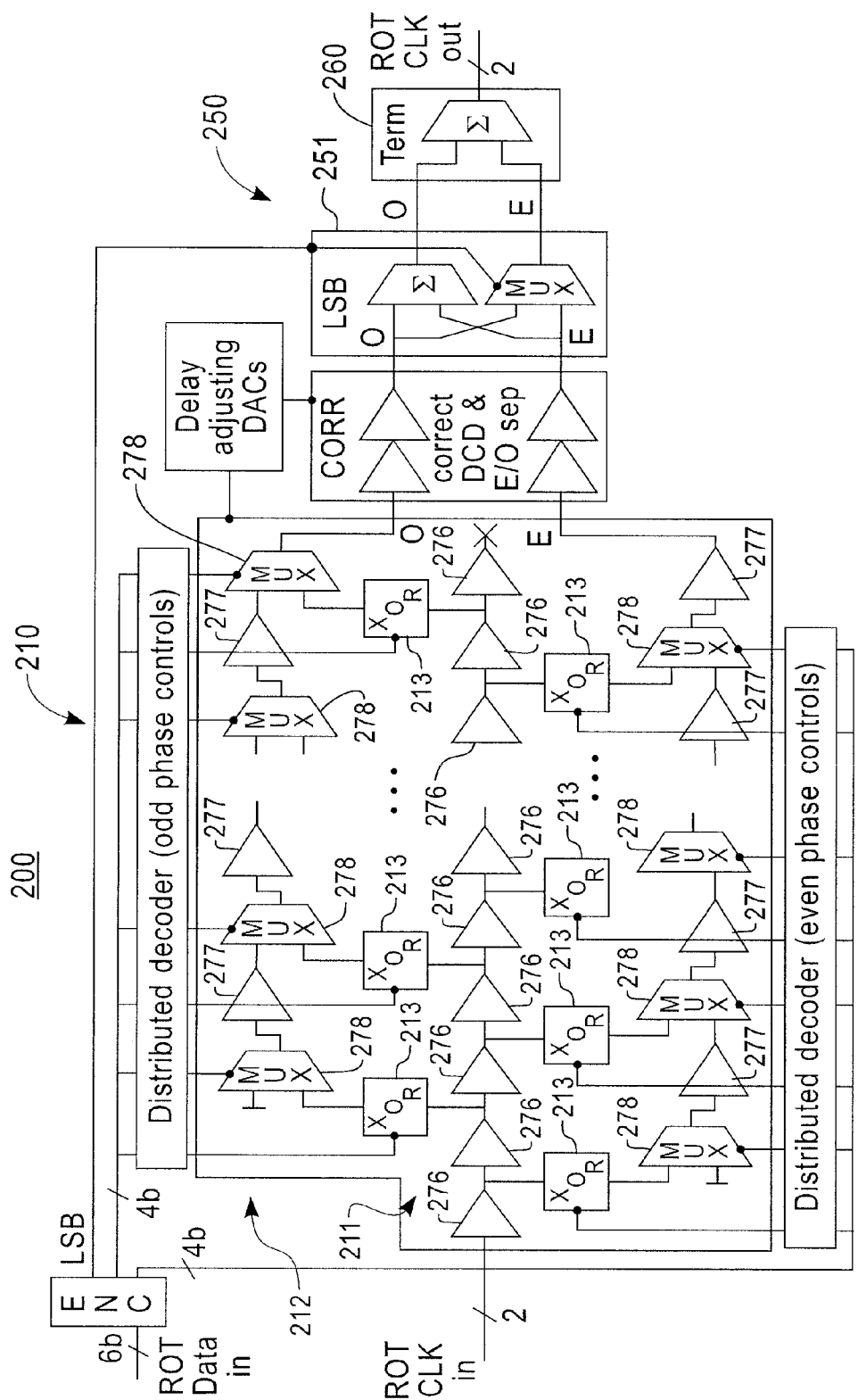
FIG. 2 is a diagram showing an all-CMOS phase rotator 200 with 64 states, in accordance with an embodiment of the present principles.
Figure 3:
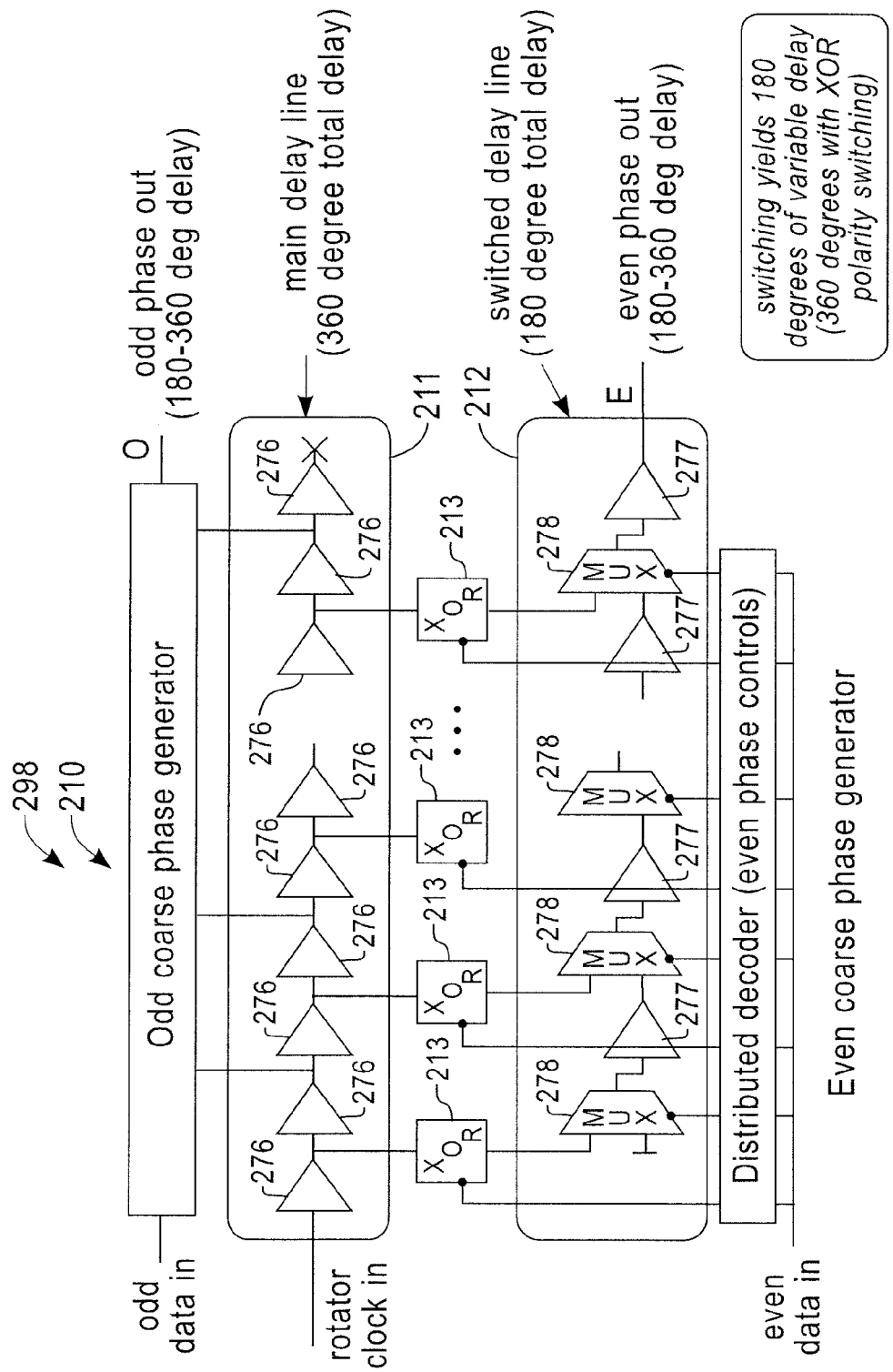
FIG. 3 is a diagram further showing a coarse stage 298 of the all-CMOS phase rotator 200 of FIG. 2, in accordance with an embodiment of the present principles.
Figure 4:
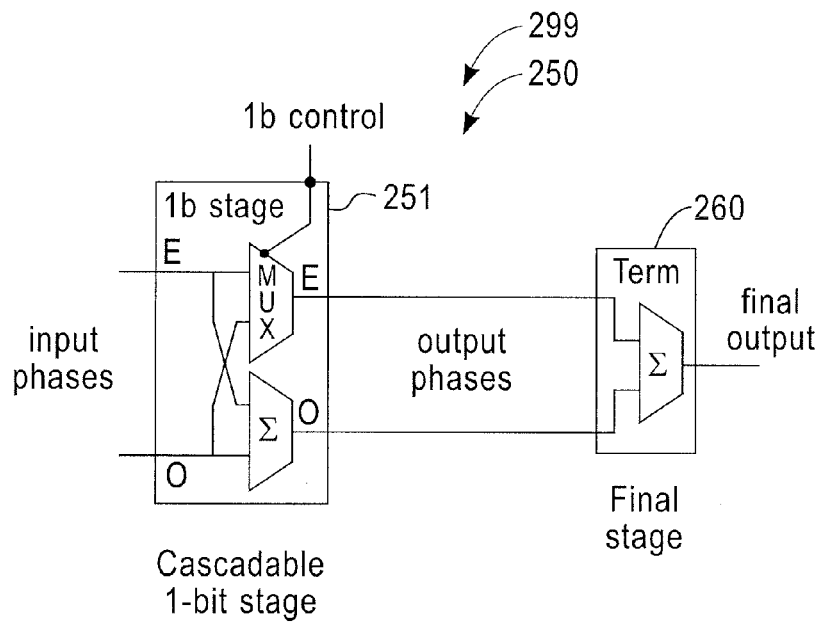
FIG. 4 is a diagram further showing a fine stage 299 of the all-CMOS phase rotator 200 of FIG. 2, in accordance with an embodiment of the present principles.

FIG. 2 shows an all-CMOS phase rotator 200 with 64 states, in accordance with an embodiment of the present principles. The all-CMOS phase rotator 200 includes a coarse stage 298 and a fine stage 299. FIG. 3 further shows the coarse stage 298 of the all-CMOS phase rotator 200 of FIG. 2 in accordance with an embodiment of the present principles. FIG. 4 further shows the fine stage 299 of the all-CMOS phase rotator 200 of FIG. 2 in accordance with an embodiment of the present principles.

The all-CMOS phase rotator 200 includes a coarse phase generator/selector 210 corresponding to the coarse stage 298 and a fine phase rotator stage 250 corresponding to the fine stage 299. The fine phase rotator stage 250 includes a fine phase one-bit cascadable interpolation section 251 and a termination stage 260. Hence, the all-CMOS phase rotator 200 of FIG. 2 has 64 states using 32 coarse phases and a single one-bit interpolation stage.

In the embodiment of FIG. 3, the coarse phase generator/selector 210 is for selecting 2 coarse phases (Even and Odd) out of a set of 32 equidistant phases that uses vernier topology. In the embodiment of FIG. 4, the fine phase rotator stage 250 includes the one-bit cascadable interpolation section 251 with two input phases and two output phases, and further includes the termination stage 260 that converts two final phases into a single output phase (denoted "final output").

Similar to the rotator 100 of FIG. 1, the incoming clock (ROT CLK IN) in the coarse stage 298 is first applied to a tapped delay line 211 that includes identical delay stages, with even and odd taps forming two separate groups (placed above and below the tapped delay line in FIGS. 2 and 3). In contrast to FIG. 1, where all M taps of a given group were first applied to a M:1 multiplexer and then to a polarity switch to obtain the final output coarse phase (even or odd), the new architecture as shown in FIG. 2 employs a uniform distributed structure made of delay elements 277 and 2:1 multiplexers 278 which form a switched delay line 212 as well delay elements 276 which form a main tapped delay line 211 to perform the same function. More specifically, each tap off of the main tapped delay line 211 is first applied to a polarity switch 213 (also labeled XOR, since that is the logical operation of a polarity swap) and then the tap is merged into a second delay line 212 (further referred to as "merging delay line") that has the same direction of signal propagation as the main tapped delay line 211, but is made of identical stages that include one delay element 277 and one 2:1 multiplexer 278 that receives at its second input the polarity-adjusted signal from a respective tap (even or odd) of the main tapped delay line 211. Only one of the taps in each group (even and odd) is active, meaning that the input clock signal (ROT CLK IN) first reaches the selected tap along the main tapped delay line 211, then propagates through the polarity selector XOR 213 and receives the desired polarity, and then propagates along the second delay line 212 in the same direction until it emerges at its respective output terminal (even or odd).

The two main distinctive features of the new architecture of the coarse rotator stage 298 shown in FIGS. 2 and 3 are first, uniformity, i.e. the topology of the structure does not change with the total number of taps (it remains a linear array of identical sections that receives an input clock signal on its left side and generates two desired coarse phases on the right side), and second, it employs a vernier topology, meaning that the change in delay of the output coarse phase in a given group when the active (selected) tap shifts by one position, is equal to a difference in delays along the main tapped delay line 211 (delay of two buffer elements) and the delay along the second (merging) delay line 212 (delay of one buffer and one 2:1 multiplexer). This difference in the two delays can be made sufficiently small to accommodate a very large number of coarse phases (like 32 in FIGS. 2 and 3) even at high clock frequencies, where the propagation delay of the main tapped delay line 211 would be significantly larger than 180 degrees. Compare that to the rotator 100 in FIG. 1 that needs the total delay of its tapped delay line to be 180 degrees leading to a limit on its maximum clock speed, since clock phase delay in a delay line with a fixed delay is proportional to the clock frequency. In a case of a vernier delay structure such as that shown in FIGS. 2 and 3, one needs to set only the difference between the two delays to 180 degrees, while each of the two delays can be larger than 180 degrees. For example, one can set the delay of the main tapped delay line 211 to 360 degrees and the delay of the merging delay line 212 to 180 degrees giving the desired difference of 180 degrees, as shown in FIG. 3.

The second independent innovation of the new rotator architecture shown in FIG. 2 is the use of a hardware-saving interpolator in the rotator fine stage 299 with a resolution of n bits that replaces a single thermometer-encoded interpolator stage using $2^n$ identical unit elements with a cascade of n identical one-bit sections, plus the additional termination stage 260. The fine rotator stage 299 shown in FIG. 4 is for the case n=1 which includes just one single-bit cascadable interpolator 251 that has two clock inputs and two clock outputs. This cascadable one bit interpolator 251 works as follows: its first output (labeled as "E" for even) simply repeats one of the two input signals via use of a 2:1 multiplexer controlled with a single-bit select signal (labeled "1b control"). The second output (labeled as "O" for odd) is obtained by 1:1 interpolation between the two inputs, therefore its output phase takes position at the mid-point between the two possible phase positions of the first output. The termination stage 260 converts the two-phase output of the last interpolation section in the cascade to a single final output. The termination stage 260 is simply a 1:1 interpolator, so it places the final output of the fine rotator stage at mid-point between the two output phases of the last single-bit interpolation stage.

Figure 5:
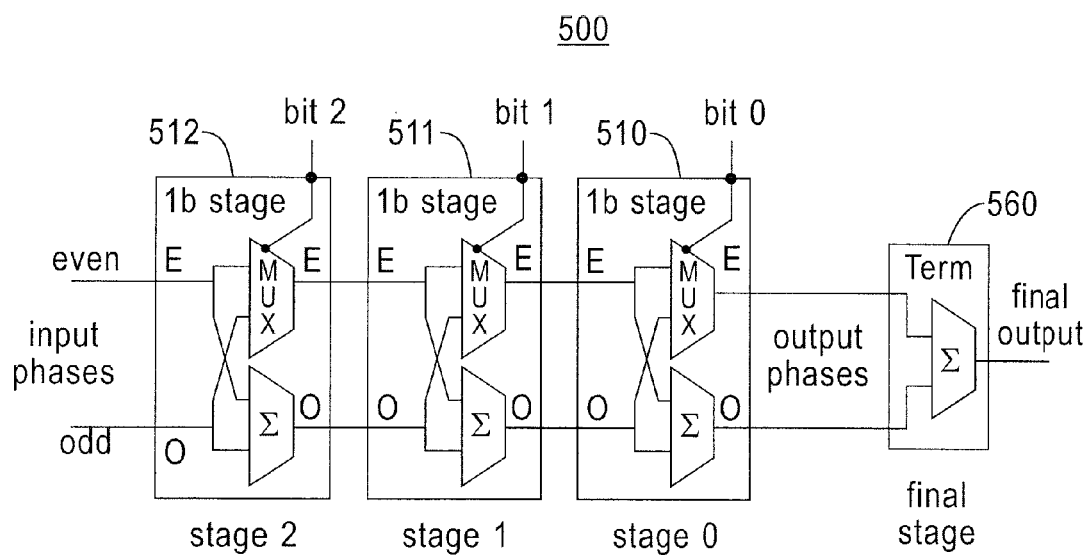
FIG. 5 is a diagram showing a 3 bit version of a fine rotator 500, in accordance with an embodiment of the present principles.
Figure 6:
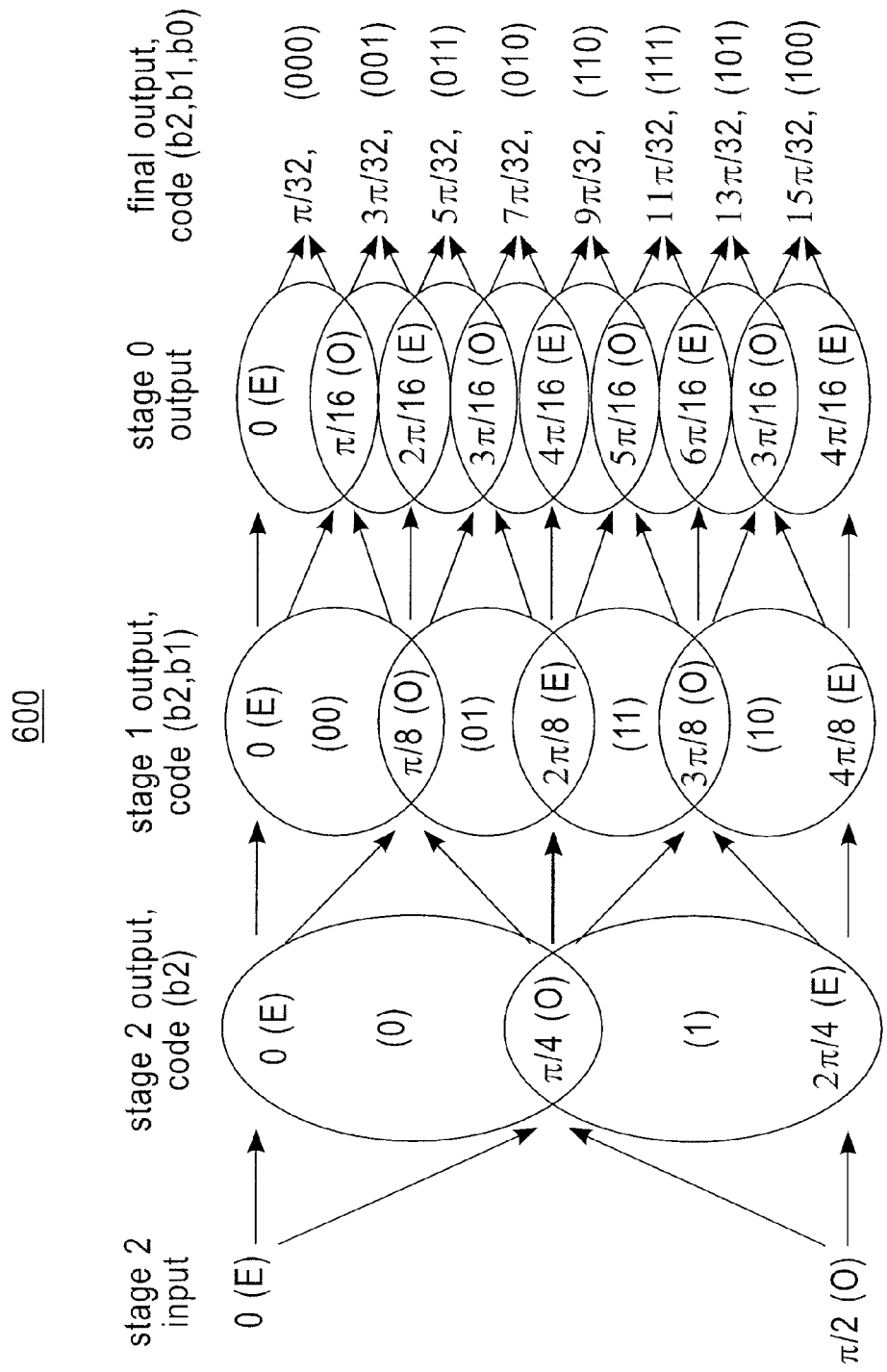
FIG. 6 is a diagram showing states 600 of the 3 bit fine rotator 500 of FIG. 5, in accordance with an embodiment of the present principles.

In order to explain the principles of clock phase transformations as they propagate through the cascade of single-bit interpolators and the final termination stage 260, let us consider a 3 bit fine phase rotator stage. FIG. 5 shows a 3 bit version of a fine rotator 500, in accordance with an embodiment of the present principles. The fine rotator 500 includes three cascaded single-bit sections (with "stage 0" denoted by the reference numeral 510, "stage 1" denoted by the reference numeral 511, and "stage 2" denoted by the reference numeral 512) and a termination stage 560 that converts two final phases into a single output phase. FIG. 6 shows states 600 of the 3 bit fine rotator 500 of FIG. 5, in accordance with an embodiment of the present principles. The 3 bit fine rotator 500 is natively controlled by Gray code and each single-bit stage doubles the number of phase states and reduces phase separation in half.

FIGS. 5 and 6 show that the resolution of the rotator 500 doubles with each single-bit interpolation stage, and that the number of phase states available at the outputs of each single-bit interpolation stage is doubled compared to its inputs. More specifically, the available output phase states always include all the available input states (those are routed to the even output) plus they include an equal amount of new interpolated states located at mid-points between the input states (those are routed to the odd output). At the same time each single-bit stage reduces the phase separation in half so the resolution of the fine rotator stage doubles with each additional interpolation stage. This is in contrast to conventional interpolation architectures where doubling the interpolation resolution is associated with doubling the hardware. FIG. 6 also illustrates how the one-bit controls of its three single-bit sections 510, 511, and 512 are switched when its output is continuously incrementing in phase and shows that the control code of such fine rotator 500 is a Gray code that changes its individual bits one at a time when transitioning between adjacent states, thus minimizing the potential for the development of glitches at the output during changes in rotator position.

This completes the architectural description of the new phase rotator, however on the circuit level (not shown in FIGS. 2-5) the phase rotator does use several innovations that are described herein below and deal predominantly with the issues of designing slew-rate-limited CMOS buffers for the purpose of delay generation, interpolation and duty cycle adjustment. A related topic is the implementation of "feedthrough-free" multiplexers that are required to implement accurate single-bit interpolators with CMOS circuits. Finally, the actual implementation of the present principles in hardware employs so-called "glitchless switching" techniques that apply both to the control of the coarse phase selector as well as the cascaded fine interpolator controlled with Gray code. In both cases the suggested solution for glitchless switching involves operating the 2:1 multiplexers as 1:1 interpolators during code changes, i.e. using two instances of a 2:1 multiplexer in parallel and applying the code change to one copy before the other.

Figures 7, 8, 9:
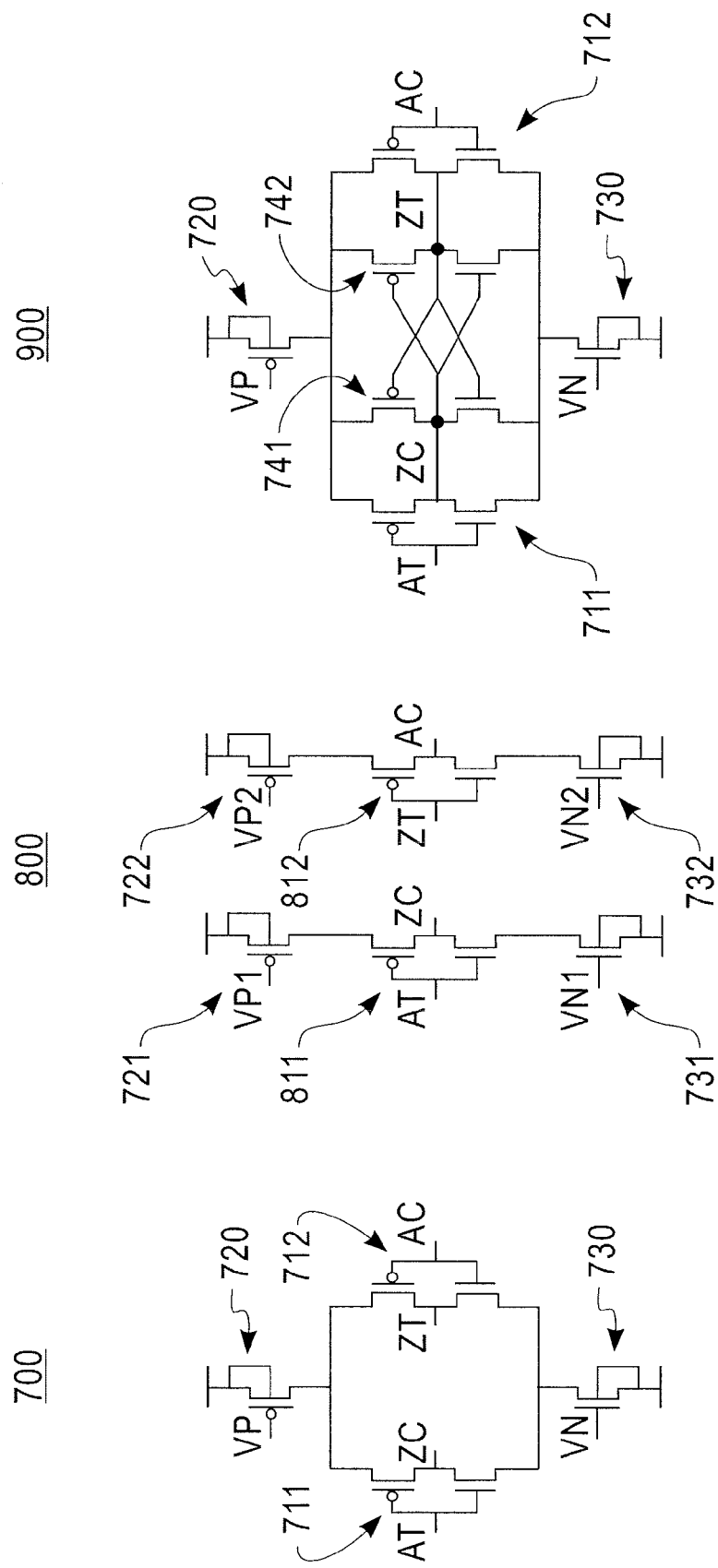
FIG. 7 is a diagram showing a dual-rail CMOS buffer stage 700 with slew rate control, in accordance with an embodiment of the present principles.
FIG. 8 is a diagram showing a duty cycle adjusting dual-rail buffer 800 with slew rate control, in accordance with an embodiment of the present principles.
FIG. 9 is a diagram showing an edge-aligned dual-rail buffer 900 with slew rate control, in accordance with an embodiment of the present principles.

We will now discuss an implementation of the buffer delay stages of the rotator. FIG. 7 shows a dual-rail CMOS buffer stage 700 with slew rate control, in accordance with an embodiment of the present principles. The dual-rail CMOS buffer stage 700 includes two inverters 711, 712 with shared supply terminals which in turn are driven by two current-limiting transistors, a PFET 720 for a pull-up path and an NFET 730 for a pull-down path. Both these transistors 720, 730 are configured as controllable current sources that drive the capacitive load at the output nodes of the inverters 711, 712 up or down, and therefore they operate as limiters of the maximum slew rate for the rising and falling edges of the inverter outputs respectively. Accordingly, by modifying these currents (via controlling the gate voltages of these transistors) one achieves independent control of the propagation delay for the rising and falling edges respectively. Normally the pull-up and pull-down currents are kept nominally equal (and hence the rise and fall slew rates of the buffer outputs and their respective delays), but in certain more complex circuits they can be controlled independently, for example, for adjusting the duty cycle of the waveforms.

FIG. 8 shows a duty cycle adjusting dual-rail buffer 800 with slew rate control, in accordance with an embodiment of the present principles. The buffer 800 is similar to the buffer 700, but in contrast supplies each inverter 811, 812 with a separate pair of pull-up 721, 722 and pull-down devices 731, 732 with independent control. That is, inverter 811 is provided with its own pull-up transistor 721 and pull-down transistor 731, and inverter 812 is provided with its own pull-up transistor 722 and pull-down transistor 732. For example, in order to increase the duty cycle of a dual-rail clock waveform with aligned edges, i.e. simultaneously increase the duty cycle of its true signal and decrease the duty cycle of the complementary signal, one increases the pull-up current and decreases the pull-down current of the inverter generating the true output and at the same time deceases the pull-up current and increases the pull-down current of the inverter generating the complementary output.

An important observation is that the two inverters of the regular dual-rail buffer in FIG. 7 can easily share a single pair of current sources due to the fact that they process complementary clock signals, so when one inverter generates a rising edge and hence uses a pull-up PFET device, the other inverter is generating a falling edge on the complementary output and therefore uses the pull-down NFET device. This mode of operation eliminates the situation when both inverters need to use the same current source at the same time and allows for sharing a single set of current sources which yields a significant circuit area savings due to the fact that the current sources usually dominate the layout area.

FIG. 9 shows an edge-aligned dual-rail buffer 900 with slew rate control, in accordance with an embodiment of the present principles. Thus, the buffer 900 provides an enhanced topology of a dual-rail slew-rate-controlled buffer that adds an edge alignment function. In comparison to the buffer 700 of FIG. 7, buffer 900 includes two additional small cross-coupled inverters 741, 742 that correct small timing mismatches between rising and falling edges of the two clock waveforms on the complementary outputs of the circuit, thus preventing misalignment error accumulation in a long chain of buffers. This buffer topology is used in all dual-rail buffers shown in FIG. 2.

Figure 10:
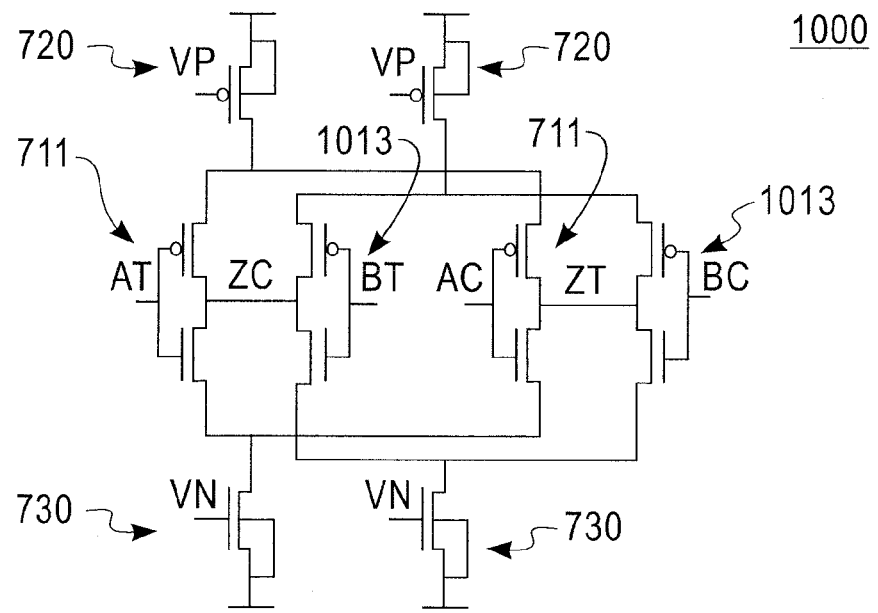
FIG. 10 is a diagram showing a 1:1 interpolator 1000, in accordance with an embodiment of the present principles.

The basic buffer topology in FIG. 7 can be also used as a building block for more complex circuits used in accordance with the teaching of the present principles, specifically, 1:1 interpolators and 2:1 multiplexers. For example, FIG. 10 shows a 1:1 interpolator 1000, in accordance with an embodiment of the present principles. The interpolator 1000 can be built from two instances of the dual-rail buffer 700 shown in FIG. 7 that have shared outputs but independent inputs. Hence, inverters 1013 are similar to inverters 711. If the difference in clock signal phases applied to these two independent inputs is small, this circuit works as a precise 1:1 interpolator, i.e. it generates the average between the respective outputs of the two unconnected buffers. This happens because when the outputs of two independent buffers with limited pull-up and pull-down currents are connected, the shared output load is initially driven only by the current sources of the buffer that receives the early clock phase, i.e. at ½ of maximum slew rate, and then upon arrival of the late clock phase the slew rate doubles to its full maximum value, thus generating the expected 1:1 interpolated output.

The reason for the input phases to be relatively close is to avoid a crow-bar condition between the two buffers. Such condition develops when the mutual delay between the two input phases is sufficiently large to become a significant portion of the output transition time. Consider that before the early clock phase transition there are no currents in the circuit, since all active pull-up and pull-down current sources (i.e. those connected to the outputs via inverters) have reached zero headroom. The inverters receiving the late phase will retain their zero currents as long as the change in the circuit outputs caused by the early-phase inverters action is small to keep the headroom of its current sources in the late-phase ones sufficiently low to prevent them from applying an opposing current to the outputs. This is easily achieved in the new architecture due to its use of the vernier principle that allows one to have relatively slow slew rates in combination with small phase separation that must be a small fraction of the total output transition time, which has a maximum value of one half of the clock period.

Figure 11:
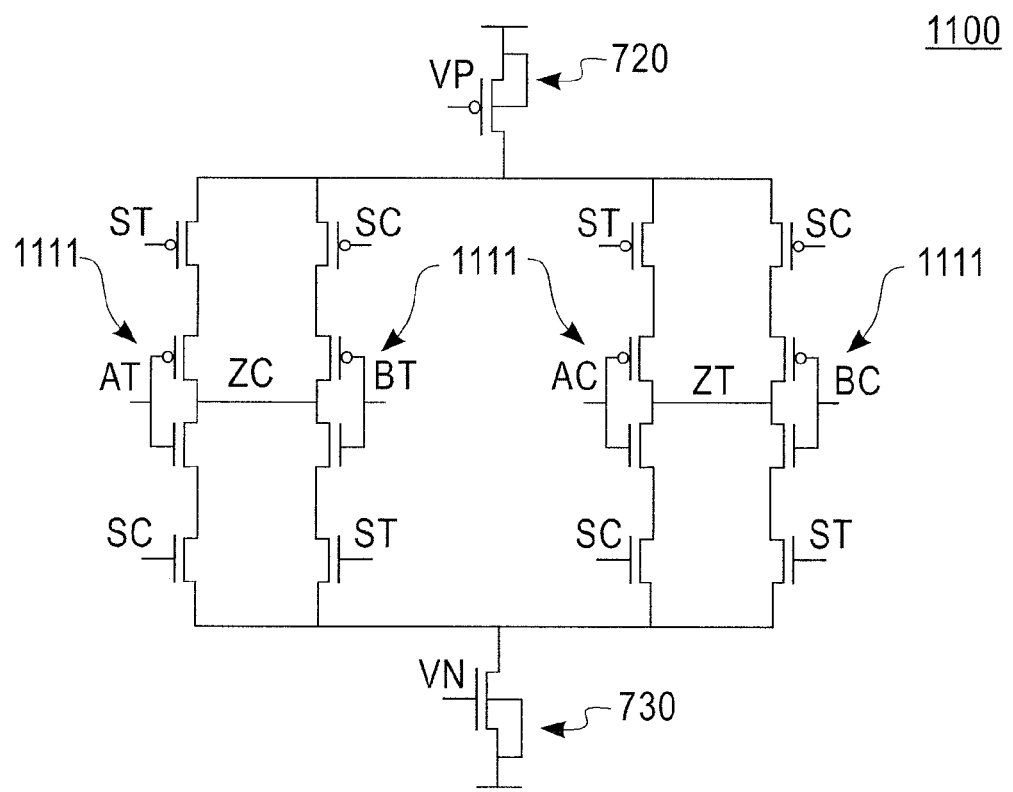
FIG. 11 is a diagram showing a 2:1 dual-rail multiplexer 1100 with a slew rate control, in accordance with an embodiment of the present principles.

FIG. 11 shows a 2:1 dual-rail multiplexer 1100 with a slew rate control, in accordance with an embodiment of the present principles. The multiplexer 1100 is similar to the buffer 700 of FIG. 7 in the sense that it is driven by just one pair of current-limiting transistors 720, 730, but uses four inverters 1111 that receive two dual-rail clock signals and these inverters 1111 are tri-state inverters in contrast to plain inverters 711, 712 in FIG. 7. The extra switches (2 each of ST and SC, as depicted in FIG. 11) within the tri-state inverters that connect and disconnect them to supply rails are configured to activate the inverters that process only one of the selected dual-rail clock phase. In other words, at any given moment such multiplexer circuit is configured as a simple buffer shown in FIG. 7 and therefore can be operated from a single set of current sources.

The primary reason to use current-limiting devices in the multiplexers 278 used in the rotator 200 shown in FIG. 2 despite the fact that the rotator can operate without the current-limiting devices (i.e., with the multiplexers 278 connected directly to the power supply rails), is to reduce the dependence of propagation delay through the multiplexers 278 on changes in the power supply voltage. This can be achieved, for example, by using a feedback loop (not shown in FIGS. 2, 3) that modifies the control voltage of the current sources to counter-act the effect of supply voltage variations for maximum suppression of changes in propagation delay.

An important shortcoming of the multiplexer 1100 shown in FIG. 11 is the effect of capacitive feed-through that can be explained as follows. Consider the disabled pair of tri-state inverters that isolate the multiplexer dual-rail output from the de-selected dual-rail clock input. Despite these inverters being powered off, i.e. disconnected from the supplies, there is still significant capacitance between their inputs and outputs that results in transients at the inputs propagating to the output (an effect known as "capacitive feed-through") and thus potentially corrupting the exact timing of the rising and falling edges of the multiplexer output leading to significant degradation of the rotator performance.

Figure 12:
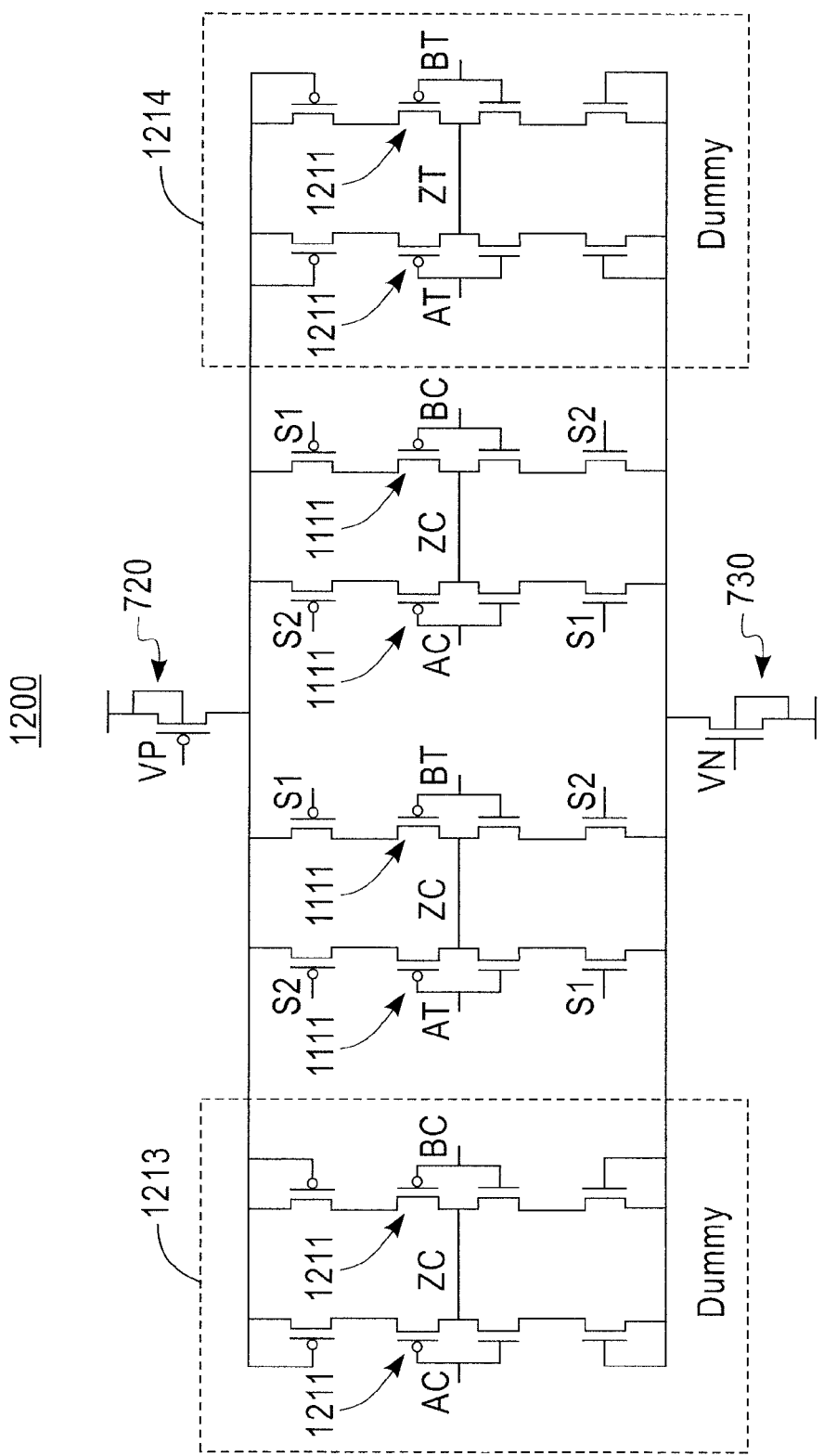
FIG. 12 is a diagram showing a modified 2:1 dual-rail multiplexer 1200 with feed-through cancelation, in accordance with an embodiment of the present principles.

There are two independent ways to cancel the effect of such capacitive feed-through, both of which are used in the invention. The first way is to add a complete set of four dummy (permanently disabled) tri-state inverters 1211 to the circuit shown in FIG. 11 that results in a circuit shown in FIG. 12 that has 8 tri-state inverters, in two groups of 4, each group sharing a common output. That is, FIG. 12 shows a modified 2:1 dual-rail multiplexer 1200 with feed-through cancellation, in accordance with an embodiment of the present principles. Each pair of dummy inverters within one group (of the groups 1213 and 1214) receives the clock signals of opposite phase in respect to the regular ones, i.e., use input signals that are already available within the circuit. With such arrangement when a given clock input is disabled, both of its polarities will couple symmetrically to the multiplexer outputs thus canceling each other. The overhead in circuit area of this approach is relatively low since the circuit area is typically dominated by the current sources which did not change, since the modified circuit with is 8 tri-state inverters still uses a single set of current sources. Its main disadvantage is that the additional disabled tristate inverters increase the load at the multiplexer output and therefore increase its delay and/or power.

There is an alternative second way to eliminate the effect of capacitive feed-through by forcing the de-selected clock input to some fixed value that can be achieved by appropriately controlling the circuit that generates it. This second approach essentially shifts the problem from the original multiplexer circuit in FIG. 11 (that is unchanged) to controlling the source of input lock signal, so if one can easily set its output to a fixed value, the second approach is preferable to the first one.

In accordance with the present principles, the first approach (extra dummy tri-state inverters 1211) is used in the fine rotator stage 299, i.e. within the singe-bit interpolators 251. The coarse phase generation stage 298, in contrast, is sensitive to additional increases in delay and/or power, and therefore it employs the second approach.

Figure 13:
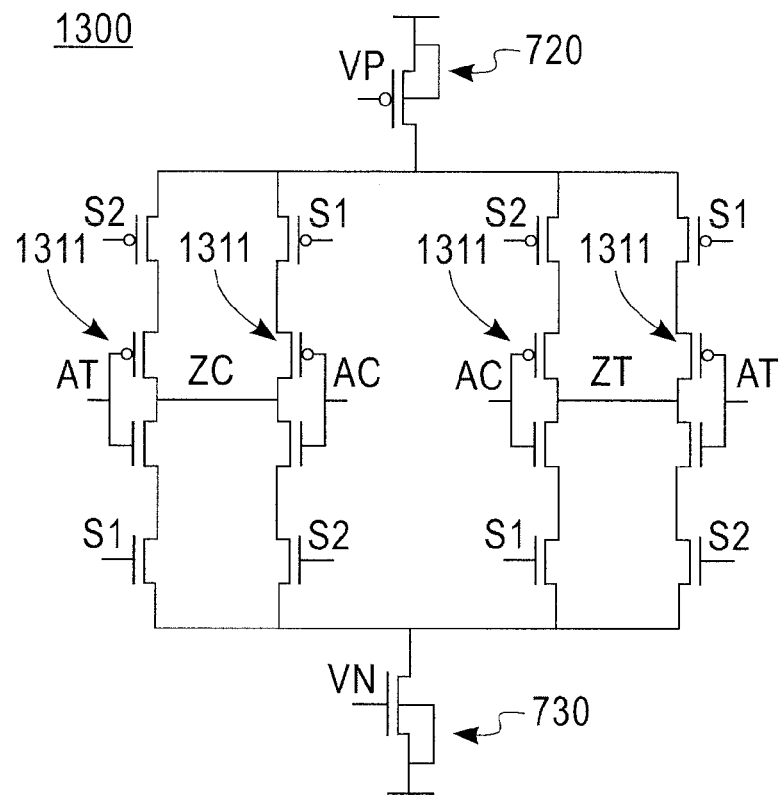
FIG. 13 is a diagram showing a polarity control (XOR) dual-rail circuit 1300 with an additional "disable" state, in accordance with an embodiment of the present principles.

Let us explain how one can implement the second approach in the coarse rotator stage 298, where the multiplexers 278 are driven by polarity control circuits (XOR) 213 on one input and by delay buffers 277 of the merging delay line 212 on the other input. Feed-through cancellation in this structure is achieved primarily by de-activating (i.e. forcing to a fixed output value) the majority of XOR circuits 213 that connect the unused taps of the main tapped delay line 211 to the multiplexers 278 of the merging delay line 212. FIG. 13 shows a polarity control (XOR) dual-rail circuit 1300 with an additional "disable" state, in accordance with an embodiment of the present principles. The XOR circuit 1300 is obtained from the 2:1 multiplexer 1100 shown in FIG. 11 by connecting its two inputs to the same dual-rail clock signal, but in opposite polarity. De-activation of a XOR circuit 1300 is achieved as follows. The tri-state inverters 1311 of this multiplexer are controlled with two logic signals S1, S2 that are nominally complementary, i.e. take either "01" or "10" values that represent selection of the inverting or non-inverting input respectively. However if one uses two equal values, e.g. "11", this polarity control circuit will force both outputs to low, i.e. to a constant value, and hence will prevent them from creating any feed-through effect in the 2:1 multiplexer circuit driven by it.

Let us now consider an independent topic of glitchless switching. Generally a glitch within the coarse phase generation stage 298 occurs when a certain multiplexer in the clock path switches between two clock phases that are significantly far apart (e.g. have opposite polarity) and therefore can assume significantly different values at the moment of switching. A particularly dangerous condition occurs at the so-called "stitching region" where the phase at one end of the delay line structure is replaced with the phase at the other end (with change in polarity to compensate for 180 degrees of phase delay along the delay line).

In order to guarantee that phase switching within the coarse phase generator is glitch-free, the following measures are taken: first, XOR cells of all taps except the main tap and two adjacent to it are kept in a disabled state, as explained above. (The main tap is the tap through which the clock is routed on its path from the tapped delay line to the even and odd merging delay lines.) In order for a tap to change polarity it must be de-activated first. Second, the 2:1 multiplexers 278 of the merging delay line 212 are configured so that the multiplexer driven by the main active tap and all multiplexers to the left of it are in the "merging" position (i.e. they accept the signal from their respective taps and disregard the signal from their preceding buffers in the merging delay line), while all multiplexers to the right of it are set in a "propagation" state, i.e. they receive the signal from the preceding buffer in the merging delay line and disregard the tap signal from their respective XOR cell input. The only exception is the leftmost multiplexer (tap 0) that has no left neighbor and hence is permanently wired in the "merge" position. The overall goal of such arrangement is to be always prepared for a tap switching (translation) process by one position in either direction, in a way that such translation of the tap position could be accomplished by switching just one 2:1 multiplexer in the merge delay line 212. More specifically, a move to the left would be accomplished by reversing the select state of the multiplexer of the main tap from merging to propagating, while moving the active tap position by one step to the right is achieved by reversing the select state of the multiplexer to the right from the main one, from propagating to merging.

Besides those primary switching events that directly alter the clock propagation path, one would also need to switch the select state of the peripheral taps to restore the same active tap configuration that is translated by one position to the left or to the right. Such translation simply means de-activation of XOR cell of one tap and activation of XOR cell of another to form a new group of three active taps. These XOR cell switching events however have no direct effect on the main clock propagation path and hence their timing is not critical.

A special case that is handled slightly differently arises near the stitching boundary that involves the taps on the two opposite sides of the coarse delay generator, since those edge positions have only one neighbor tap. In order to make moves of active tap position across the stitching boundary identical to regular ones, the structure uses a redundant tap (numbered 8) that replicates the first tap (numbered 0) in a sense that the two are set exactly 180 degrees apart in phase and are always activated in opposite polarity states, so the clock paths routed through them would result in an identical output (selection of which one is actually routed to the output is determined by the select state of the multiplexer associated with the redundant, $8^{th}$ tap). With such arrangement when both tap 0 and tap 8 are active, one uses tap 1 as the "right" extra tap, and tap 7 as "left" extra tap of the "three taps active" combination and hence the general rule described in the preceding paragraph for regular (non-boundary) taps seamlessly applies to the redundant boundary tap pair 0,8.

In order to further enhance the glitch suppression capabilities of the coarse phase generator all multiplexers within the merge delay lines are implemented as 1:1 interpolators, i.e. they are made of two identical multiplexer 1100 instances shown in FIG. 11 that share the inputs and outputs, but have independent selection controls. The two sets of controls in turn are obtained from a single set by using two mutually delayed copies of it, so the "early" set simply copies the original control set, while the "late" set is delayed by one period of a clock signal that is used to operate the rotator controls (generally slower than the main rotator clock). Such arrangement means that during the control clock period when early set has already changed, but the late set still holds the original value, the multiplexer operates as 1:1 interpolator similar to interpolator 1000 shown in FIG. 10. As it has been described in the previous section which introduced the concept of three active taps, the clock phases that are applied to the multiplexers are already sufficiently close in phase, so their interpolation product forms a properly-shaped new clock phase that has an intermediate phase value, so no glitching occurs on the clock waveform even if it goes through a transition at the moment when the multiplexer switching takes place. Separation of the switching into two intermediate events (early and late) also simplifies the management of XOR cell activations and deactivations during tap transition by one position. Specifically, all new XOR cell activations take place immediately on early event arrival, thus bringing the total number of active taps temporarily from three to four, while all de-activations take place one control clock period later, thus bringing the number of active taps back to three, but in an updated configuration.

An additional benefit of using interpolating multiplexers takes place in the redundant ($8^{th}$) tap which during activation of this tap (as main, center tap) is allowed to assume either one of its two select states, i.e. choose either routing the clock signal through tap 0 (the leftmost) or through tap 8 (the rightmost). In practice, the best position to choose in this case is of constant (non-transitory) 1:1 interpolation between these two paths since it minimizes the error arising from the finite accuracy of setting the delay line to a phase delay of 180 degrees (commonly referred to as "stitching error"). The latter position is easily achievable with the interpolating multiplexer by applying the controls accordingly.

The interpolating multiplexer enables glitchless switching not only in the coarse phase generator, but also in the fine rotator section composed of a cascade of single-bit interpolators. As a diagram of fine rotator states in FIG. 6 shows, the code employed by the fine rotator is Gray, meaning that the neighbor states are different in only one control bit which already minimizes the risk of glitching significantly. Nevertheless use of an additional intermediate step during the switching of a single-bit interpolation section, particularly for the highest-weight (MSB) section provides additional protection against edge distortions during code transitions.

Figure 14:
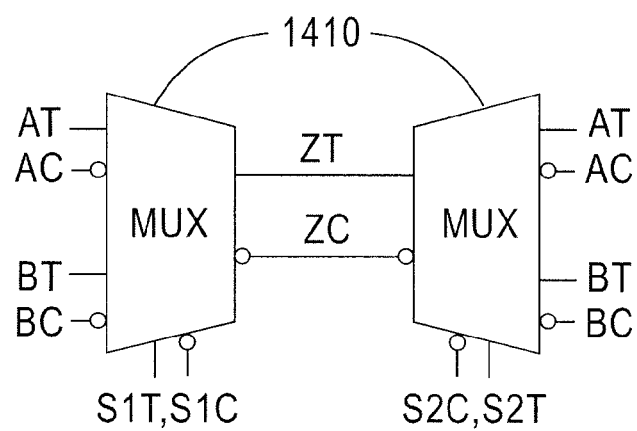
FIG. 14 is a diagram showing an interpolator 1400, in accordance with an embodiment of the present principles.

Let us consider the structure of a single-bit fine interpolation rotator stage in more detail. While on block diagram such stage is composed of two different devices, a 2:1 multiplexer (with feed-through compensation) and a 1:1 interpolator, in actual implantation both of these devices are made of identical parts, specifically, each is made of a pair of slew-rate-limited 2:1 multiplexers with internal feed-through compensation, as it is shown in FIG. 14. Within each pair of these multiplexers the inputs and outputs are shared, while select controls are separate. One pair serves as a permanent 1:1 interpolator for the odd phase output and so the select bits of its two multiplexers are permanently wired to two opposite values, so one instance of the multiplexer drives the output with the first input, while the other drives it with the second input yielding 1:1 interpolation action. The pair that serves as a multiplexer of the two input clock phases (labeled even and odd) is controlled similarly to the interpolating multiplexes within the merging delay lines described earlier, i.e. the select inputs of its two multiplexers are driven with the "early" and "late" copies of the select signals. An important advantage of using identical parts to implement the multiplexer and the 1:1 interpolator of the single-bit interpolation section is that it guarantees equal propagation delays for the signals forming its even and odd outputs, which benefits significantly the rotator accuracy.

Figure 15:
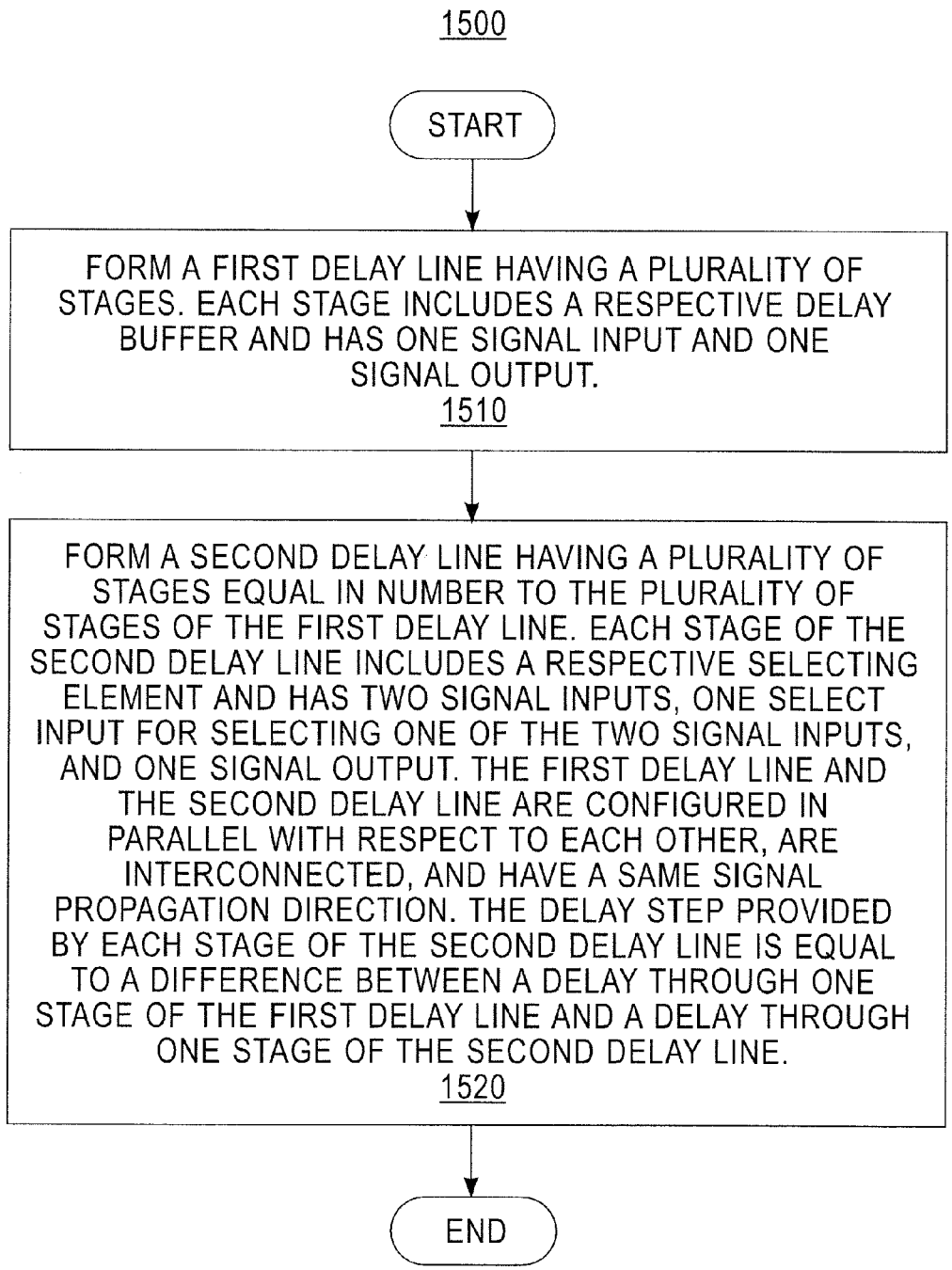
FIG. 15 is a diagram showing a method 1500 for programmable delay generation of equal delay steps, in accordance with an embodiment of the present principles.

FIG. 15 shows a method 1500 for programmable delay generation of equal delay steps, in accordance with an embodiment of the present principles. The phase rotation is implemented using signals having full rail-to-rail swing.

At step 1510, a first delay line is formed having a plurality of stages. Each of the plurality of stages includes a respective delay buffer and having one signal input and one signal output.

At step 1520, a second delay line is formed having a plurality of stages equal in number to the plurality of stages of the first delay line. Each of the plurality of stages of the second delay line includes a respective selecting element and has two signal inputs, one select input for selecting one of the two signal inputs, and one signal output. The first delay line and the second delay line are configured in parallel with respect to each other, are interconnected, and have a same signal propagation direction. The delay steps provided by each of the plurality of stages of the second delay line is equal to a difference between a delay through one of the plurality of stages of the first delay line and a delay through one of the plurality of stages of the second delay line.

Figure 16:
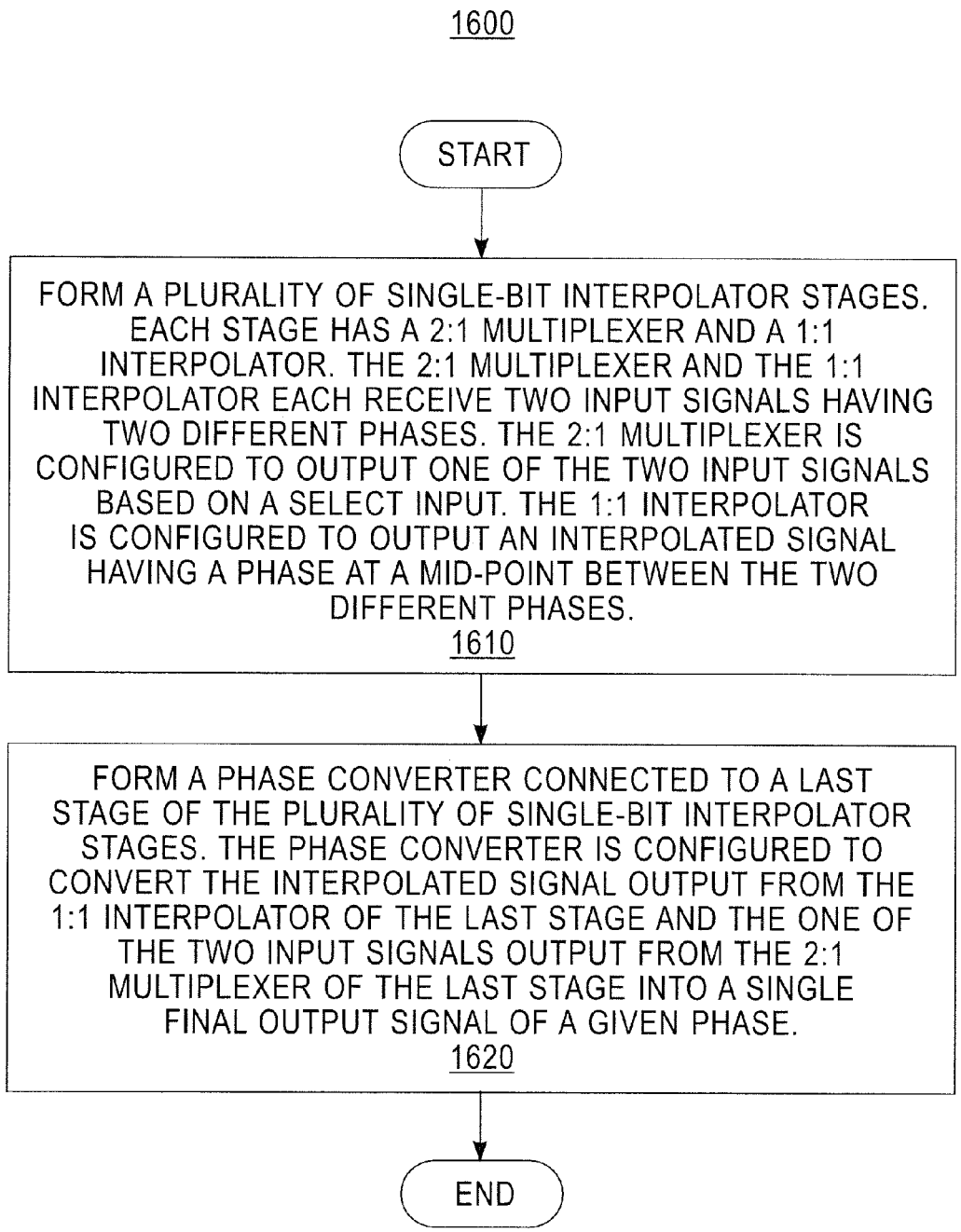
FIG. 16 is a diagram showing a method 1600 for cascaded interpolation, in accordance with an embodiment of the present principles.

FIG. 16 shows a method 1600 for cascaded interpolation, in accordance with an embodiment of the present principles.

At step 1610, a plurality of single-bit interpolator stages is formed. Each of the stages has a 2:1 multiplexer and a 1:1 interpolator. The 2:1 multiplexer and the 1:1 interpolator each receive two input signals having two different phases. The 2:1 multiplexer is configured to output one of the two input signals based on a select input. The 1:1 interpolator is configured to output an interpolated signal having a phase at a mid-point between the two different phases.

At step 1620, a phase converter is formed connected to a last stage of the plurality of single-bit interpolator stages. The phase converter is configured to convert the interpolated signal output from the 1:1 interpolator of the last stage and the one of the two input signals output from the 2:1 multiplexer of the last stage into a single final output signal of a given phase.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A programmable delay generator of equal delay steps, comprising:
   a first delay line having a plurality of stages, each of the plurality of stages including a respective delay buffer and having one signal input and one signal output; and
   a second delay line having a plurality of stages equal in number to the plurality of stages of the first delay line, each of the plurality of stages of the second delay line including a respective selecting element and having two signal inputs, one select input for selecting one of the two signal inputs, and one signal output,
   wherein the first delay line and the second delay line are configured in parallel with respect to each other, are interconnected, and have a same signal stage propagation order, and wherein each of the delay steps provided by each of the plurality of stages of the second delay line is equal to a difference between a delay through one of the plurality of stages of the first delay line and a delay through one of the plurality of stages of the second delay line.

2. The programmable delay generator of claim 1, wherein the one signal output of each of the plurality of stages of the first delay line except a last one of the plurality of stages is respectively connected to the one signal input of a next one of the plurality of stages of the first delay line and to one of the two signal inputs of a corresponding one of the plurality of stages of the second delay line.

3. The programmable delay generator of claim 2, wherein the input clock signal is received by a first one of the plurality of stages of the first delay line and is sequentially propagated to each of the following ones of the plurality of stages of the first delay line until the last one.

4. The programmable delay generator of claim 3, wherein the one signal output of each of the plurality of stages of the second delay line is respectively connected to one of the two signal inputs of a next one of the plurality of stages of the second delay line, and wherein a last one of the plurality of stages of the second delay line forms an output of the programmable delay generator.

5. The programmable delay generator of claim 1, wherein a propagation path for the input clock signal is configured such that the input clock signal propagates through the plurality of stages of the first delay line and also propagates through a respective activated tap formed from the one signal output of a given one of the plurality of stages of the first delay line to a given one of the two inputs of a given one of the plurality of stages of the second delay line and following ones of the plurality of stages of the second delay line.

6. The programmable delay generator of claim 1, wherein different propagation delays for the input clock signal are obtained by activating different taps of the first delay line, wherein each of the different taps is respectively formed from the one signal output of a respective one the plurality of stages of the first delay line.

7. The programmable delay generator of claim 6, further comprising one or more additional delay lines, each having a same configuration as the second delay line, wherein a respective output of the second delay line formed from the one signal output of a last one of the plurality of stages of the second delay line provides a first delayed output signal from the programmable delay generator, and wherein the one or more additional delay lines provide additional delayed output signals each having different delays.

8. The programmable delay generator of claim 7, wherein each of the second delay line and the one or more additional delay lines respectively comprise a set of taps connected to the first delay line, and the different delays are obtained by activating different ones of the taps.

9. The programmable delay generator of claim 6, further comprising a plurality of polarity switches, each of the plurality of polarity switches being connected in between a respective one of the different taps of the first delay line and a respective one of corresponding merging taps of the second delay line, and is configured to provide a desired polarity to the input clock signal before the input clock signal propagates through the second delay line.

10. The programmable delay generator of claim 1, wherein the programmable delay generator is comprised within a coarse phase generation stage of a two-stage phase rotator.

11. The programmable delay generator of claim 1, wherein each of the plurality of stages of the second delay line further includes a respective delay buffer coupled to an output of the respective switching element.

12. The programmable delay generator of claim 1, wherein the respective switching element comprises a 2:1 multiplexer.

13. The programmable delay generator of claim 1, wherein the first delay line and the second delay line are configured to generate full-swing signals.

14. A method for programmable delay generation of equal delay steps, comprising:

forming a first delay line having a plurality of stages, each of the plurality of stages including a respective delay buffer and having one signal input and one signal output; and forming a second delay line having a plurality of stages equal in number to the plurality of stages of the first delay line, each of the plurality of stages of the second delay line including a respective selecting element and having two signal inputs, one select input for selecting one of the two signal inputs, and one signal output, wherein the first delay line and the second delay line are configured in parallel with respect to each other are interconnected and have a same signal stage propagation order, and wherein each of the delay steps provided by each of the plurality of stages of the second delay line is equal to a difference between a delay through one of the plurality of stages of the first delay line and a delay through one of the plurality of stages of the second delay line.

15. The method of claim 14, further comprising configuring a propagation path for the input clock signal such that the input clock signal propagates through each of the plurality of stages of the first delay line and also propagates through a respective activated tap formed from the one signal output of a given one of the plurality of stages of the first delay line to a given one of the two inputs of a given one of the plurality of stages of the second delay line and following ones of the plurality of stages of the second delay line.

16. The method of claim 14, wherein the first delay line and the second delay line are configured to generate full-swing signals.

* * * * *